United States Patent
Lin

(10) Patent No.: US 10,900,719 B2
(45) Date of Patent: Jan. 26, 2021

(54) HEAT DISSIPATION UNIT

(71) Applicant: ASIA VITAL COMPONENTS CO., LTD., New Taipei (TW)

(72) Inventor: Sheng-Huang Lin, New Taipei (TW)

(73) Assignee: Asia Vital Components Co., LTD, New Taipei (TW)

( * ) Notice: Subject to any disclaimer, the term of this patent is extended or adjusted under 35 U.S.C. 154(b) by 72 days.

(21) Appl. No.: 16/199,211

(22) Filed: Nov. 25, 2018

(65) Prior Publication Data

US 2019/0093957 A1 Mar. 28, 2019

Related U.S. Application Data

(63) Continuation of application No. 14/952,922, filed on Nov. 26, 2015, now abandoned.

(51) Int. Cl.
*F28D 15/02* (2006.01)
*H01L 23/427* (2006.01)
*H01L 21/48* (2006.01)

(52) U.S. Cl.
CPC ..... *F28D 15/0233* (2013.01); *F28D 15/0275* (2013.01); *H01L 21/4878* (2013.01); *H01L 23/427* (2013.01)

(58) Field of Classification Search
CPC ............ F28D 15/0233; F28D 15/0275; H01L 23/427; H01L 21/4878
See application file for complete search history.

(56) References Cited

U.S. PATENT DOCUMENTS

| 5,268,812 | A * | 12/1993 | Conte ................. F28D 15/0233 361/698 |
| 6,408,934 | B1 * | 6/2002 | Ishida ................. F28D 15/0233 165/104.33 |
| 7,493,939 | B2 * | 2/2009 | Xia ....................... H01L 23/427 165/104.26 |
| 8,286,693 | B2 * | 10/2012 | Whitney ................ B21D 53/02 165/104.21 |
| 8,960,267 | B2 * | 2/2015 | Huang .................. H01L 23/427 165/80.3 |
| 9,327,369 | B2 * | 5/2016 | Lin ........................ B23P 15/26 |
| 2005/0201061 | A1 * | 9/2005 | Nikfar ................. F28D 15/0275 361/700 |
| 2009/0260782 | A1 * | 10/2009 | Whitney ............. F28D 15/0233 165/104.21 |

(Continued)

*Primary Examiner* — Jon T. Schermerhorn, Jr.
(74) *Attorney, Agent, or Firm* — Demien K. Jackson; Jackson IPG PLLC

(57) ABSTRACT

A heat dissipation unit includes a heat pipe and a base seat. The base seat has a first side and a second side. The second side is formed with a channel and multiple perforations in communication with the first and second sides. The heat pipe has a heat absorption section and a conduction section. The conduction section extends from the heat absorption section in a direction to at least one end of the heat pipe distal from the heat absorption section. Several parts of the heat pipe corresponding to the perforations are received in the perforations and flush with the first side of the base seat. The heat dissipation unit improves the shortcoming of the conventional heat dissipation component that the coplanar precision between the heat pipe and the protruding platform of the base seat is hard to control.

4 Claims, 6 Drawing Sheets

(56) References Cited

U.S. PATENT DOCUMENTS

| | | | | |
|---|---|---|---|---|
| 2009/0266513 A1* | 10/2009 | Xiong | ............... | H01L 23/427 165/80.3 |
| 2013/0126125 A1* | 5/2013 | Wang | ............... | F28D 15/0233 165/67 |
| 2015/0276321 A1* | 10/2015 | Huang | ............... | F28D 15/0275 165/104.21 |
| 2016/0295679 A1* | 10/2016 | Yeini | ............... | H05K 5/061 |

* cited by examiner

HEAT DISSIPATION UNIT

The present application is a continuation of U.S. patent application Ser. No. 14/952,922, filed on Nov. 26, 2015.

BACKGROUND OF THE INVENTION

1. Field of the Invention

The present invention relates generally to a heat dissipation unit, and more particularly to a heat dissipation unit with better heat contact plane face.

2. Description of the Related Art

A current electronic apparatus has a central processing unit and other calculation chips inside. In operation, all of the central processing unit and the calculation chips will generate heat. Therefore, a heat dissipation component is needed to help in increasing the heat dissipation efficiency so as to more effectively dissipate the heat. The most often used heat dissipation components are such as heat pipes, vapor chambers, heat sinks and radiating fins. These components serve to speed the heat conduction or transfer the heat to a remote end to dissipate the heat or enlarge the heat dissipation area to enhance the heat dissipation performance. In general, the heat sink is in contact with the central processing unit to conduct the heat generated by the central processing unit. The heat sink can provide larger heat dissipation area. In order to transfer the heat at higher heat conduction speed, a heat pipe is combined with the heat sink.

In addition, the section of the heat sink in contact with the central processing unit is formed with a perforation or a channel to directly expose the heat pipe to outer side into contact with the central processing unit to conduct the heat and transfer the heat to the heat sink with larger heat dissipation area to dissipate the heat. Such heat dissipation component composed of the heat pipe and the heat sink is often employed. However, such heat dissipation component still has some shortcomings needing to be improved. That is, one side of the heat sink is formed with a channel for receiving the heat pipe and the heat pipe is fixed in the channel by means of passing the heat pipe through the heat sink or perpendicularly positioning the heat pipe on the heat sink. Under such circumstance, the heat pipe will partially protrude from the section of the heat sink that is in contact with the central processing unit. As a result, the flatness is poor to cause heat resistance. Conventionally, the protruding parts are processed and milled off. However, the parts of the heat pipe that protrude from the channel of the heat sink are not positioned on the same level. Moreover, the wall of the heat pipe often has non-uniform thickness. Therefore, when milling off the protruding parts of the heat pipe, it quite often takes place that the heat pipe is over-milled to damage the wall of the heat pipe. In this case, the heat pipe will lose its function.

SUMMARY OF THE INVENTION

To achieve the above and other objects, the heat dissipation unit of the present invention includes a heat pipe and a base seat. The base seat has a first face as a heat contacting face and a second face as a heat dissipation face. The heat dissipation face has a channel. The channel has a channel bottom side formed with at least one perforation passing through the channel bottom side of the channel and the heat contacting face corresponding to a heat source. The heat pipe is disposed in the channel and extends in a horizontal direction. The heat pipe has a first pressing face and a connecting face. A first external force is applied to the first pressing face to make the first pressing face flush with the heat dissipation face, whereby the first pressing face and the heat dissipation face together form a first coplanar face. The connecting face is in contact with the channel bottom side of the channel. A local area of the connecting face is formed with at least one deformed protrusion corresponding to the perforation. The deformed protrusion is filled in the perforation of the channel bottom side of the channel. The deformed protrusion is formed with a second pressing face. A second external force is applied to the second pressing face to make the second pressing face flush with the heat contacting face of the base seat, whereby the second pressing face and the heat contacting face together form a second coplanar face in contact with the heat source. Accordingly, the heat of the heat source can be respectively perpendicularly transferred through the heat contacting face of the base seat to the heat dissipation face and through the second pressing face of the heat pipe and then transferred in the horizontal direction of the heat pipe.

The heat dissipation unit of the present invention improves the shortcoming of the conventional heat dissipation unit composed of a heat dissipation base board and a heat pipe that when assembled, the coplanar precision between the heat pipe and the section of the heat dissipation base board in contact with the heat source can be hardly controlled.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
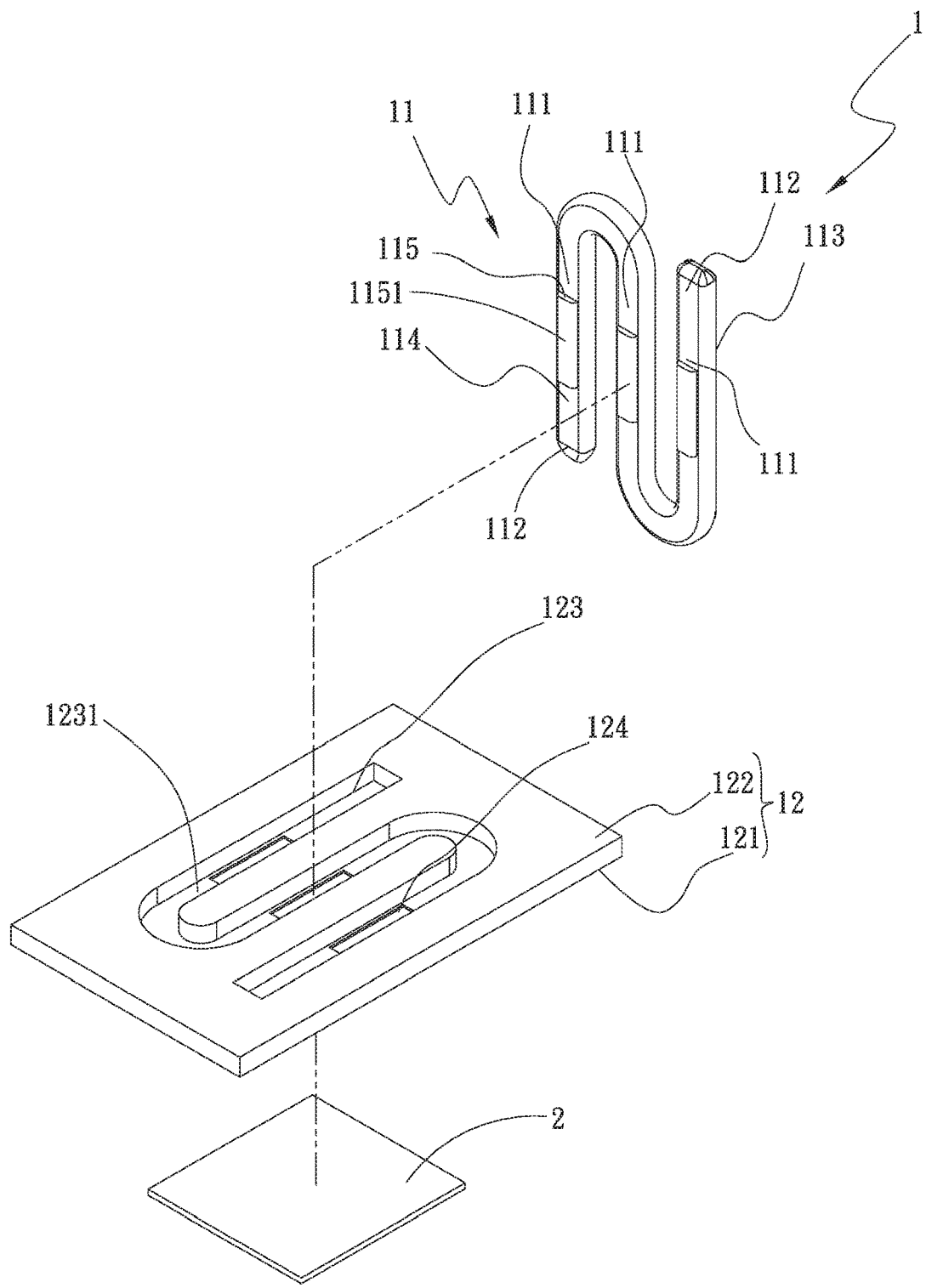
FIG. 1 is a perspective exploded view of a first embodiment of the heat dissipation unit of the present invention.
Figure 2:
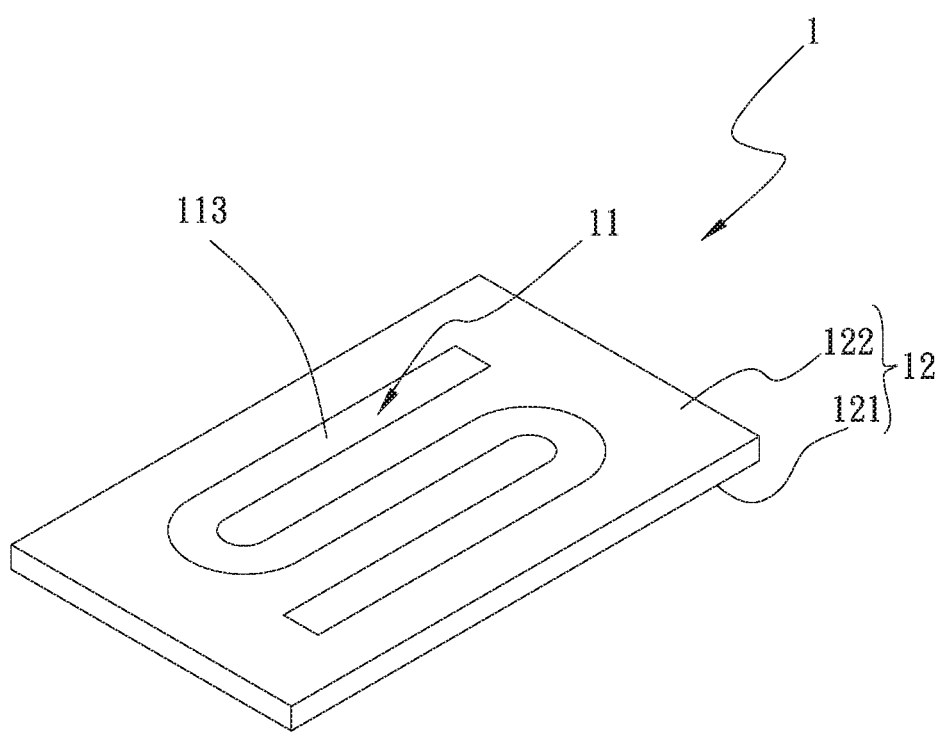
FIG. 2 is a perspective assembled view of the first embodiment of the heat dissipation unit of the present invention.

Please refer to FIGS. 1 and 2. FIG. 1 is a perspective exploded view of a first embodiment of the heat dissipation unit of the present invention. FIG. 2 is a perspective assembled view of the first embodiment of the heat dissipation unit of the present invention. As shown in the drawings, the heat dissipation unit 1 includes a heat pipe 11 and a base seat 12.

The base seat 12 has a first face and a second face respectively positioned on an upper side and a lower side of the base seat 12. The first face serves as a heat contacting face 121, while the second face serves as a heat dissipation face 122. The heat dissipation face 122 has a channel 123.

The channel 123 has a channel bottom side 1231 formed with at least one perforation 124 passing through the channel bottom side 1231 of the channel 123 and the heat contacting face 121 corresponding to a heat source 2.

The heat pipe 11 has a heat absorption section 111 and a conduction section 112. The conduction section 112 extends from the heat absorption section 111 in a direction to at least one end of the heat pipe 11 distal from the heat absorption section 111. The heat pipe 11 is selected from a group consisting of flat-plate heat pipe, D-shaped heat pipe, circular heat pipe and an assembly thereof.

The heat pipe 111 is disposed in the channel 123 and extends in a horizontal direction. The heat pipe 111 has a first pressing face 113 and a connecting face 114.

Figure 3:
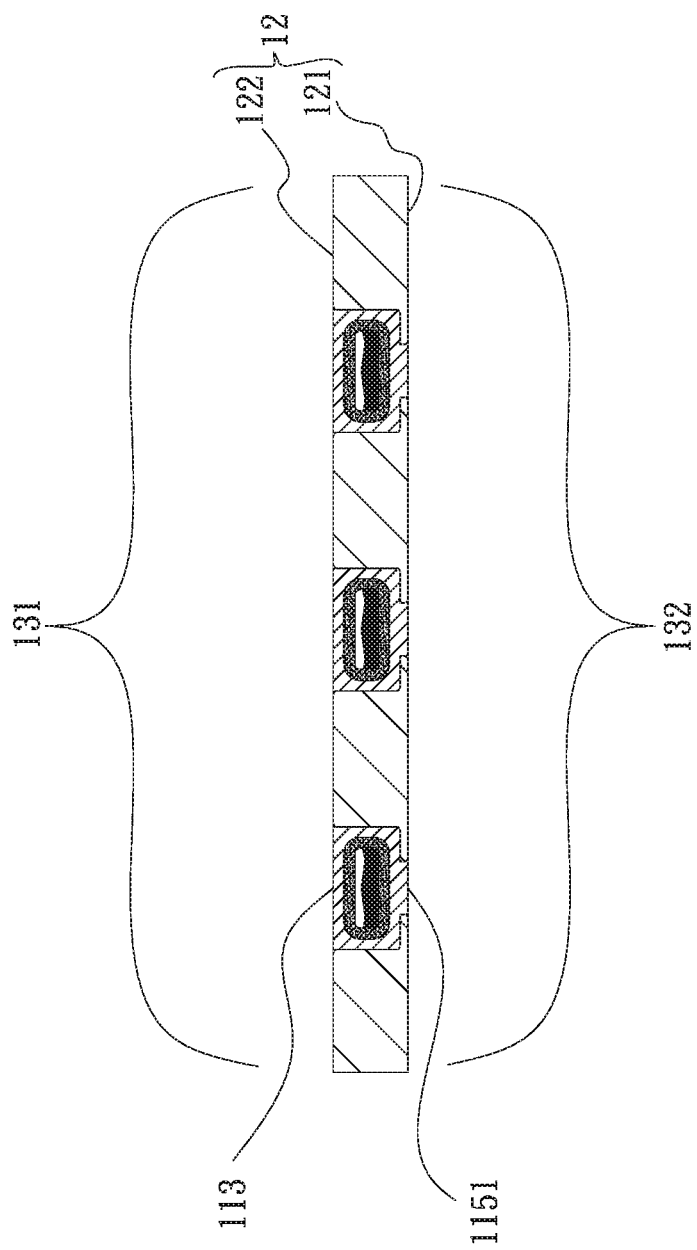
FIG. 3 is a sectional assembled view of the first embodiment of the heat dissipation unit of the present invention.

Please refer to FIG. 3 as well as FIGS. 1 and 2. A first external force is applied to the first pressing face 113 to make the first pressing face 113 flush with the heat dissipation face 122. The connecting face 114 is in contact with the channel bottom side 1231 of the channel 123. A local area of the connecting face 114 is formed with at least one deformed protrusion 115 corresponding to the perforation 124. The deformed protrusion 115 is filled in the perforation 124 of the channel bottom side 1231 of the channel 123. The deformed protrusion 115 is formed with a second pressing face 1151. A second external force is applied to the second pressing face 1151 to make the second pressing face 1151 flush with the heat contacting face 121 of the base seat 12. The first pressing face 113 and the heat dissipation face 122 together form a first coplanar face 131, while the second pressing face 1151 and the heat contacting face 121 together form a second coplanar face 132 in contact with a top face of the heat source 2.

Accordingly, the heat of the heat source 2 can be respectively perpendicularly transferred through the heat contacting face 121 of the base seat 12 to the heat dissipation face 122 and through the second pressing face 1151 of the heat pipe 11 and then transferred in the horizontal direction of the heat pipe 11. By means of the above structure, the heat dissipation unit 1 of the present invention provides two kinds of heat transfer paths for dissipating the heat of the heat source 2. Also, the precision of the plainness of the plane face of the heat dissipation unit 1 in contact with the heat source 2 can be enhanced.

Figure 4:
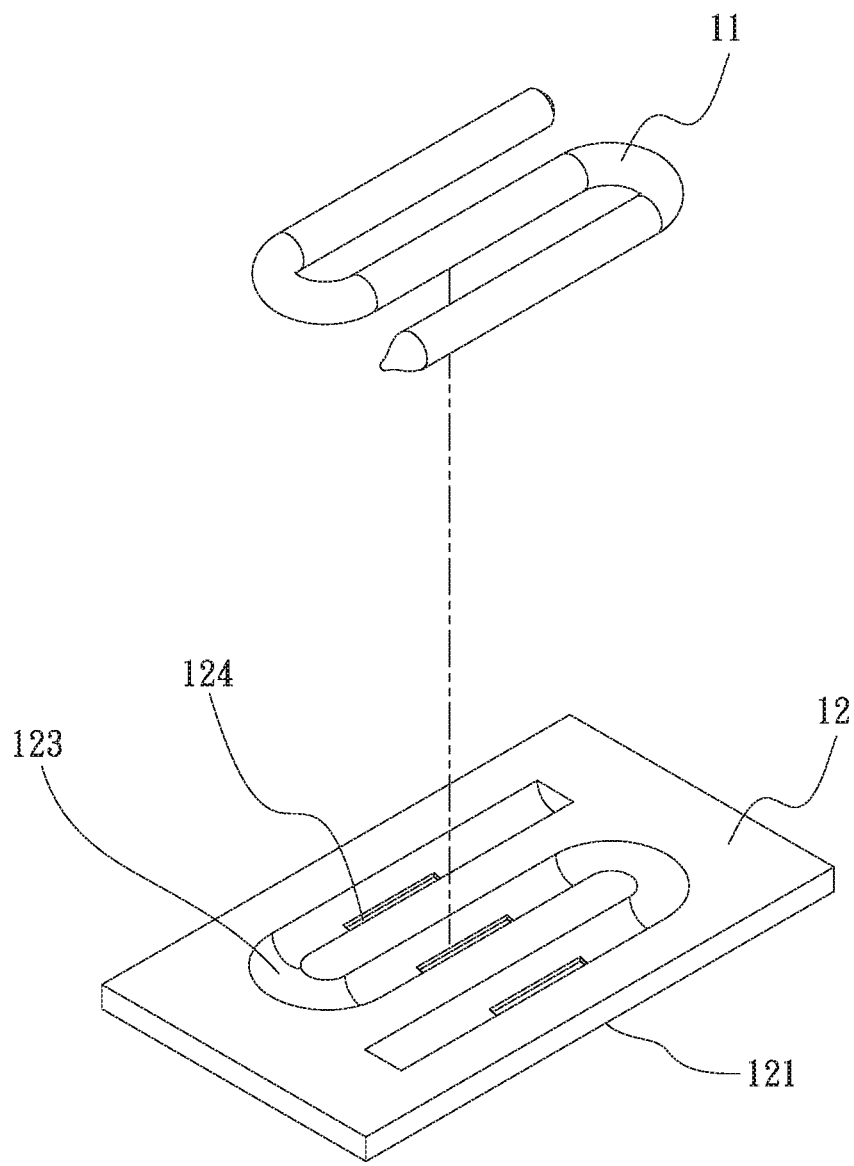
FIG. 4 is a perspective exploded view of a second embodiment of the heat dissipation unit of the present invention.
Figure 5:
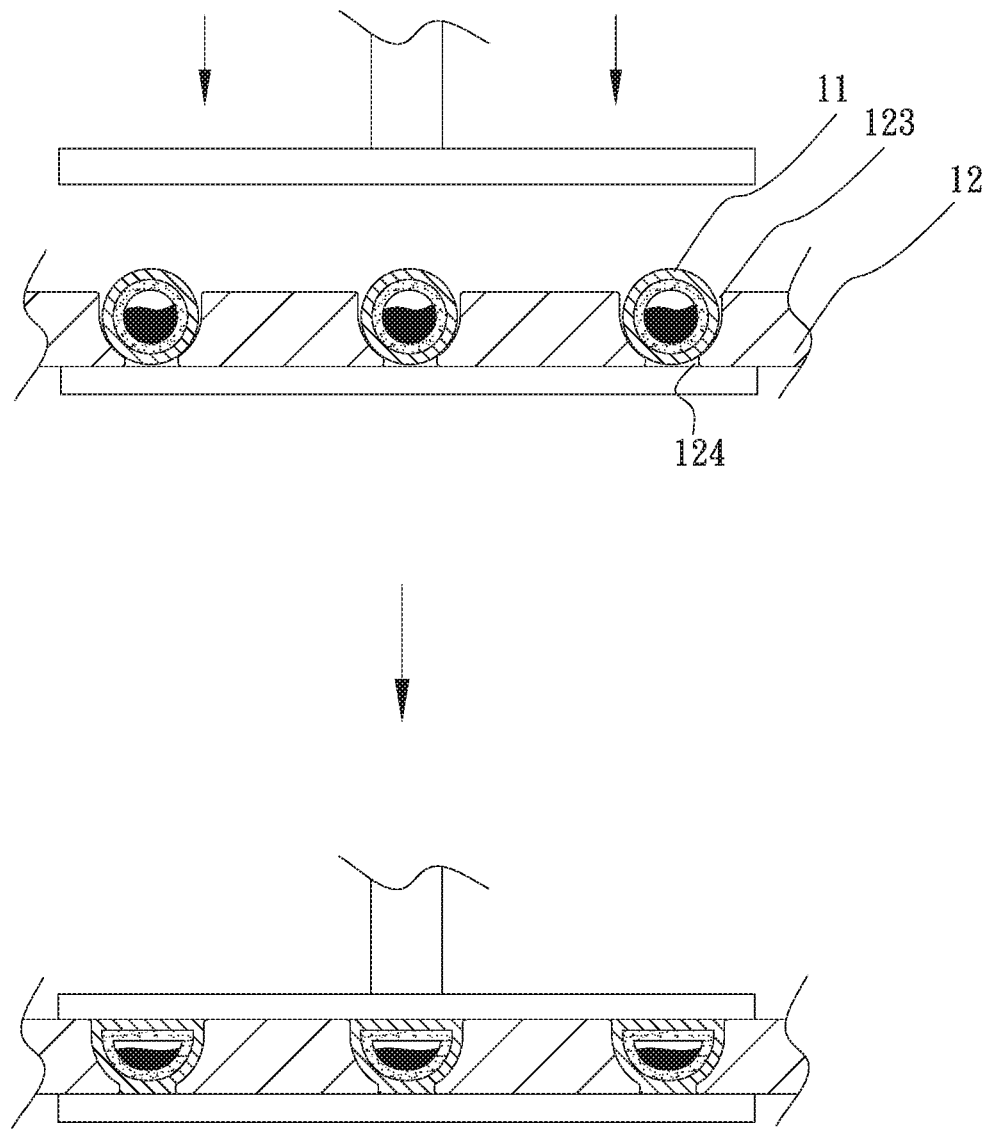
FIG. 5 is a sectional view showing the processing of the heat dissipation unit of the present invention.
Figure 6:
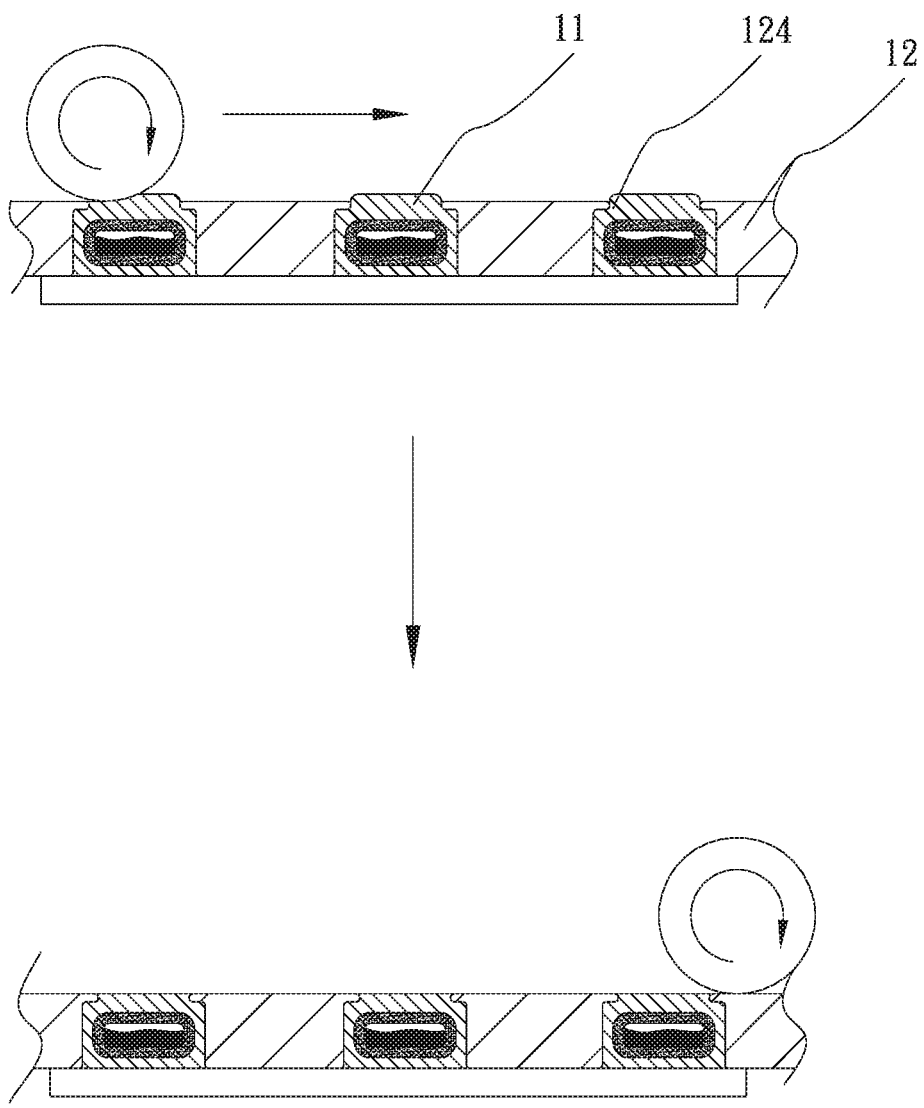
FIG. 6 is another sectional view showing the processing of the heat dissipation unit of the present invention.

Please now refer to FIG. 4, which is a perspective exploded view of a second embodiment of the heat dissipation unit of the present invention. In this embodiment, the heat pipe 11 is a circular heat pipe connected with the base seat 12. When the circular heat pipe 11 is placed into the channel 123 of the base seat 12 (the channel has an arched cross section in this embodiment), the heat pipe 11 partially protrudes from the channel 123 of the base seat 12. By means of mechanical processing (pressing and rolling), the section of the heat pipe 11 that protrudes from the channel 123 is forced into the channel 123 and filled into the perforations 124. Accordingly, the heat pipe 11 is shaped by the channel 123 and the perforations 124 and tightly bonded therewith. After mechanically processed and compressed, the heat pipe 11 may partially extrude from the perforations 124 and protrude from the first side 121 of the base seat 12. At this time, again by means of mechanical processing, the extruding part of the heat pipe 11 can be pressed back into the perforations 124 to be flush with the first side 121 of the base seat 12. Accordingly, the deformed two sides of the heat pipe 11 can be correspondingly flush with the first and second sides 121, 122 of the base seat 12. In this embodiment, a press processing is employed as the mechanical processing for illustration purposes (as shown in FIG. 5). However, the mechanical processing is not limited to the press processing. Alternatively, the mechanical processing can be rolling (as shown in FIG. 6).

The present invention has been described with the above embodiments thereof and it is understood that many changes and modifications in the above embodiments can be carried out without departing from the scope and the spirit of the invention that is intended to be limited only by the appended claims.

What is claimed is:

1. A heat dissipation unit comprising:
a base seat having a first face as a heat contacting face and a second face as a heat dissipation face, the heat dissipation face having a channel, the channel having a channel bottom side formed with at least one perforation passing through the channel bottom side of the channel, wherein the at least one perforation is peripherally surrounded by the base seat and the heat contacting face corresponding to a heat source and
a heat pipe disposed in the channel and extending in a horizontal direction, the heat pipe having a first pressing face and a connecting face, a first external force being applied to the first pressing face to make the first pressing face flush with the heat dissipation face, whereby the first pressing face and the heat dissipation face together form a first coplanar face, the connecting face being in contact with the channel bottom side of the channel, a local area of the connecting face being formed with at least one deformed protrusion corresponding to the perforation, the deformed protrusion being filled in the perforation of the channel bottom side of the channel, the deformed protrusion being formed with a second pressing face, a second external force being applied to the second pressing face to make the second pressing face flush with the heat contacting face of the base seat, whereby the second pressing face and the heat contacting face together form a second coplanar face in contact with the heat source, whereby the heat of the heat source can be respectively perpendicularly transferred through the heat contacting face of the base seat to the heat dissipation face and through the second pressing face of the heat pipe and then transferred in the horizontal direction of the heat pipe.

2. The heat dissipation unit as claimed in claim 1, wherein the heat pipe is a flat-plate heat pipe or a D-shaped heat pipe.

3. The heat dissipation unit as claimed in claim 1, wherein the heat pipe having has a heat absorption section and a conduction section.

4. The heat dissipation unit as claimed in claim 3, wherein the deformed protrusion is formed at the heat absorption section.

* * * * *